United States Patent
Ko et al.

(10) Patent No.: US 9,852,947 B1
(45) Date of Patent: Dec. 26, 2017

(54) FORMING SIDEWALL SPACERS USING ISOTROPIC ETCH

(71) Applicant: Taiwan Semiconductor Manufacturing Company, Ltd., Hsin-Chu (TW)

(72) Inventors: Chung-Ting Ko, Kaohsiung (TW); Kuang-Yuan Hsu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/271,318

(22) Filed: Sep. 21, 2016

(51) Int. Cl.
| | |
|---|---|
| *H01L 21/768* | (2006.01) |
| *H01L 21/311* | (2006.01) |
| *H01L 21/02* | (2006.01) |
| *H01L 29/66* | (2006.01) |

(52) U.S. Cl.
CPC .... *H01L 21/76897* (2013.01); *H01L 21/0228* (2013.01); *H01L 21/31111* (2013.01); *H01L 21/76802* (2013.01); *H01L 29/6656* (2013.01)

(58) Field of Classification Search
CPC ......... H01L 21/76897; H01L 21/76802; H01L 29/6656; H01L 21/0228; H01L 21/31111
USPC .......................................................... 438/652
See application file for complete search history.

(56) References Cited

U.S. PATENT DOCUMENTS

| | | | | |
|---|---|---|---|---|
| 6,521,956 B1* | 2/2003 | Lee | ............... | H01L 21/28525 257/382 |
| 2007/0155074 A1* | 7/2007 | Ho | ............... | H01L 21/28035 438/197 |
| 2008/0029896 A1* | 2/2008 | Lee | ............... | H01L 21/76843 257/767 |

* cited by examiner

*Primary Examiner* — Caleen Sullivan
(74) *Attorney, Agent, or Firm* — Slater Matsil, LLP

(57) ABSTRACT

A method includes etching a dielectric layer to form an opening, with a component of a transistor being exposed through the opening. A spacer layer is formed, and includes a horizontal portion at a bottom of the opening, and a vertical portion in the opening. The vertical portion is on a sidewall of the dielectric layer. An isotropic etch is performed on the spacer layer to remove the horizontal portion, and the vertical portion remains after the isotropic etch. The remaining vertical portion forms a contact plug spacer. A conductive material is filled into the opening to form a contact plug.

20 Claims, 25 Drawing Sheets

FORMING SIDEWALL SPACERS USING ISOTROPIC ETCH

BACKGROUND

In the manufacturing of integrated circuits, sidewalls spacers are widely used for isolating certain features such as conductive features from other features. The sidewall spacers are vertical features whose vertical dimensions are greater than the respective horizontal dimensions. The formation of the sidewall spacers typically involves forming a blanket spacer layer, and performing an anisotropic etch to remove the horizontal portions of the blanket spacer layer. The remaining vertical portions are then left as the sidewall spacers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
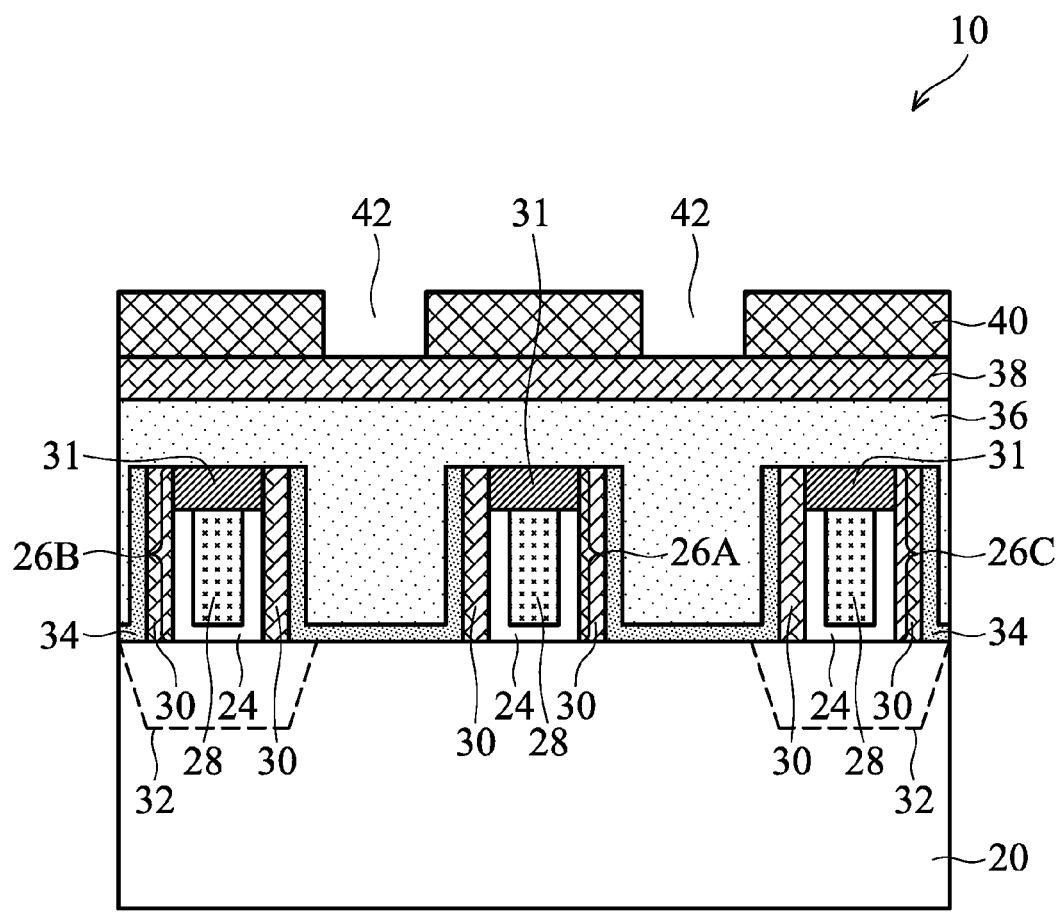
FIGS. 1A through 14 are cross-sectional views of intermediate stages in the formation of a transistor in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 24:
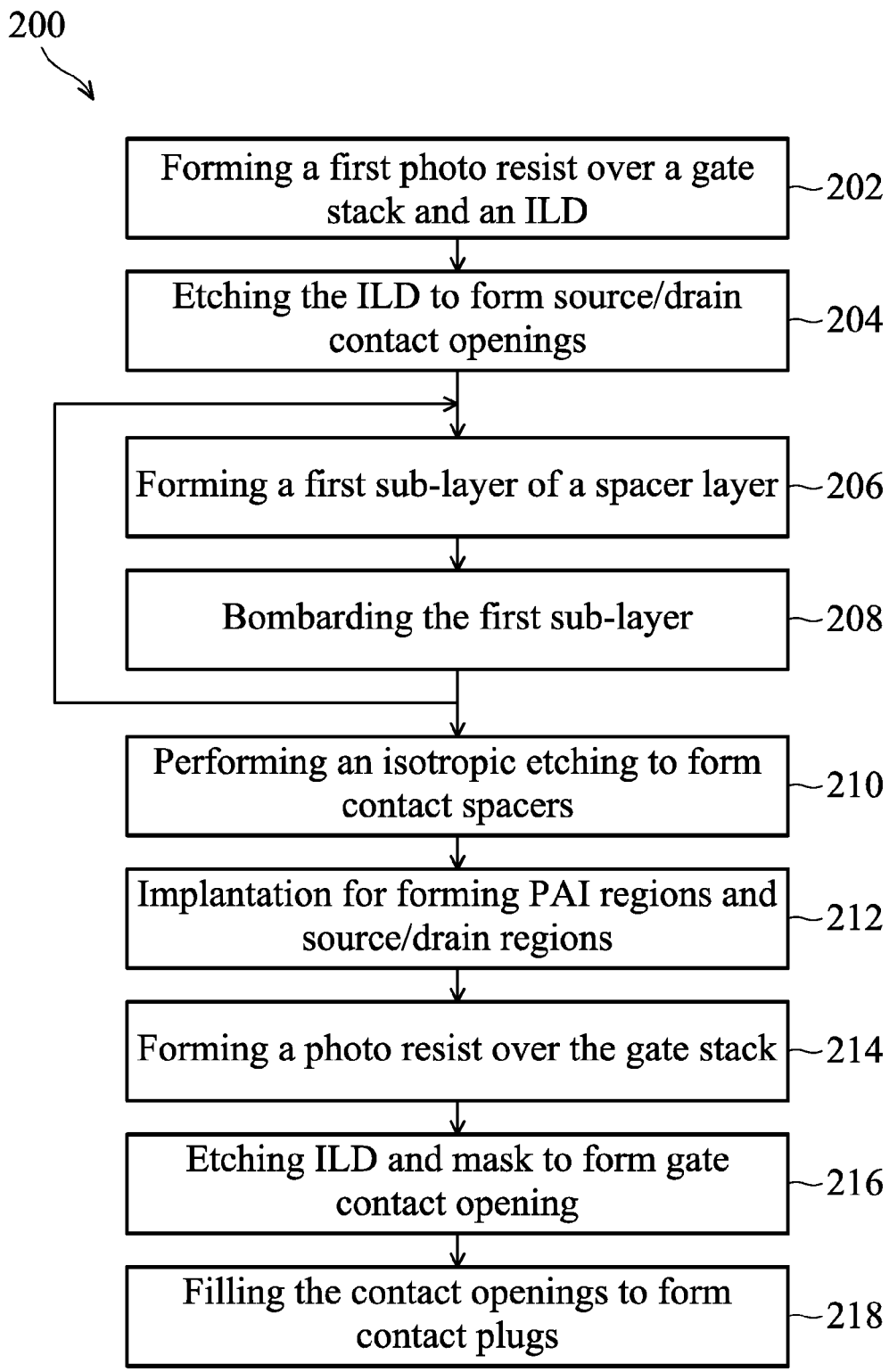
FIG. 24 illustrates a process flow for forming a transistor in accordance with some embodiments.

A transistor having replacement gates and the method of forming the same are provided in accordance with various exemplary embodiments. The intermediate stages of forming the transistor are illustrated. The variations of the embodiments are discussed. Throughout the various views and illustrative embodiments, like reference numbers are used to designate like elements. The steps shown in FIGS. 1A through 14 are also illustrated schematically in the process flow 200 shown in FIG. 24.

FIGS. 1A through 14 are cross-sectional views of intermediate stages in the manufacturing of a Metal-Oxide-Semiconductor (MOS) transistor and the respective contact plugs in accordance with some exemplary embodiments. Referring to FIG. 1A, wafer 10 is provided. Wafer 10 includes substrate 20, which may be formed of a semiconductor material such as silicon, silicon germanium, silicon carbon, III-V compound semiconductor materials, or the like. Substrate 20 may be a bulk substrate or a Semiconductor-On-Insulator (SOI) substrate.

Gate stacks 26A, 26B, and 26C, which are collectively referred to as gate stacks 26, are formed over substrate 20. Each of gate stacks 26A, 26B, and 26C may include gate dielectric 24, gate electrode 28 formed over gate dielectric 24, and hard mask 31 over gate electrode 28. In accordance with some embodiments of the present disclosure, gate stacks 26 are replacement gate stacks, which are formed by forming dummy gate stacks, removing the dummy gate stacks to form recesses, and forming the replacement gates in the recesses. As a result, gate dielectrics 24 include bottom portion underlying the respective gate electrodes 28, and sidewall portions on the sidewalls of gate electrodes 28.

Gate dielectric 24 may be a single layer or a composite layer that includes a plurality of layers. For example, gate dielectric 24 may include an interfacial oxide layer and a high-k dielectric layer over the oxide layer. The oxide layer may be a silicon oxide layer formed through thermal oxidation or chemical oxidation. The high-k dielectric layer may have a k value greater than 7, or even greater than 20. Exemplary high-k dielectric materials include hafnium oxide, zirconium oxide, lanthanum oxide, or the like.

In accordance with some embodiments of the present disclosure, gate electrode 28 has a single-layer structure formed of a homogeneous conductive material. In accordance with alternative embodiments, gate electrode 28 has a composite structure including a plurality of layers formed of TiN, TaSiN, WN, TiAl, TiAlN, TaC, TaN, aluminum, or combinations thereof. The formation of gate electrode 28 may include Physical Vapor Deposition (PVD), Metal-Organic Chemical Vapor Deposition (MOCVD), and/or other applicable methods. Hard mask 31 may be formed of silicon nitride, for example.

Figure 1B:
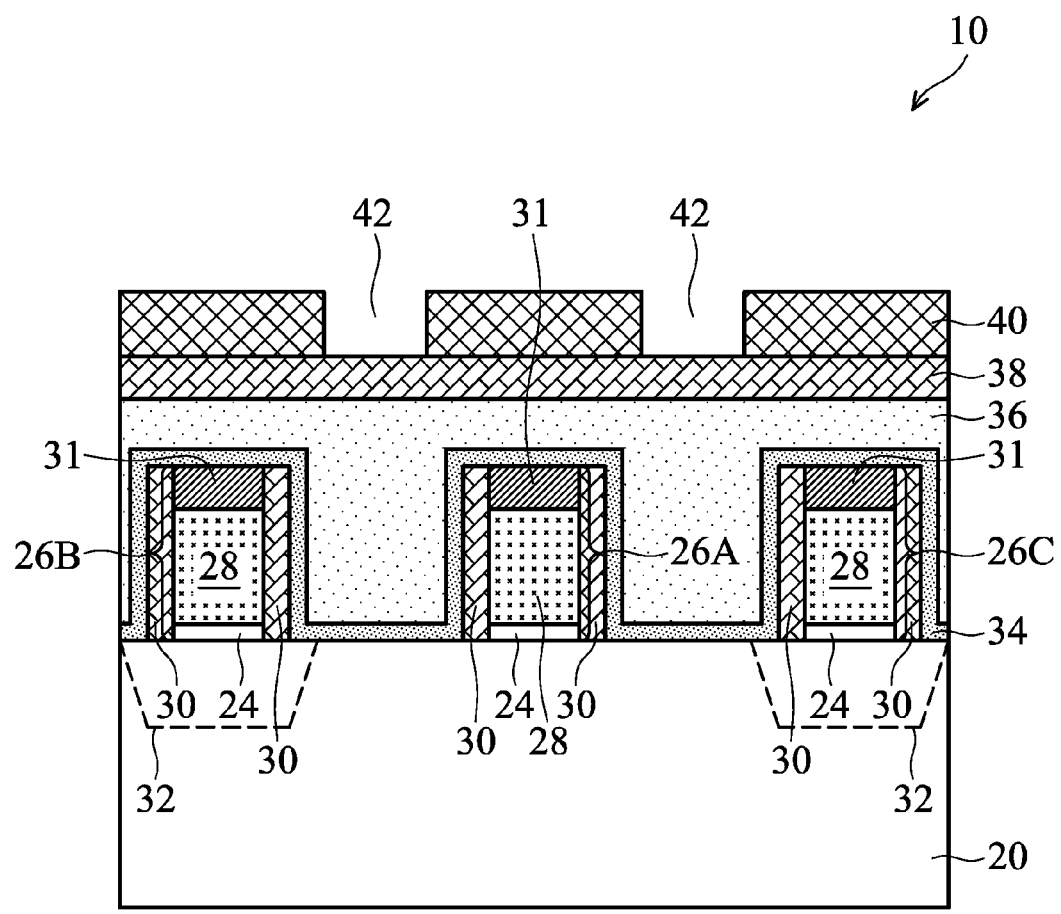

In accordance with alternative embodiments of the present disclosure, as shown in FIG. 1B, rather than being replacement gate stacks, gate stacks 26A, 26B, and 26C are formed by forming a blanket gate dielectric layer and a blanket gate electrode layer (such as a polysilicon layer), and then patterning the blanket gate dielectric layer and the blanket gate electrode layer.

In accordance with some embodiments of the present disclosure, gate stacks 26A, 26B, and 26C are formed as gate stack strips (in a top view of the structure) parallel to each other. In accordance with alternative embodiments, gate stacks 26B and 26C are not formed, and Shallow Trench Isolation (STI) regions 32 are formed to define a portion of semiconductor substrate 20 as an active region for forming the transistor.

Referring back to FIG. 1A (also shown in FIG. 1B), Contact Etch Stop Layer (CESL) 34 is formed to cover substrate 20, and may extend on the sidewalls of gate spacers 30. In accordance with some embodiments of the present disclosure, CESL 34 comprises silicon nitride, silicon carbide, or other dielectric materials. Inter-Layer Dielectric (ILD) 36 is formed over CESL and gate stacks 26A, 26B, and 26C. ILD 36 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like. The formation may include, for example, Chemical Vapor Deposition (CVD), Flowable CVD (FCVD), spin-on coating, or the like.

Mask layer 38 is formed over ILD 36. In accordance with some embodiments of the present disclosure, mask layer 38 is a metal hard mask, which may be formed of titanium nitride (TiN), for example. Photo resist 40 is formed over mask layer 38, and is patterned to have openings 42 therein. The respective step is shown as step 202 in the process flow shown in FIG. 24. Next, referring to FIG. 2, photo resist 40 is used to etch mask layer 38, thus extending openings 42 down into mask layer 38. ILD 36 and CESL 34 are then etched using the patterned mask layer 38 as an etching mask, so that openings 42 extend into ILD 36 and CESL 34. Openings 42 are source/drain contact openings in accordance with some embodiments. The respective step is shown as step 204 in the process flow shown in FIG. 24. Mask layer 38 is then removed, and the resulting structure is shown in FIG. 3.

Figure 4:
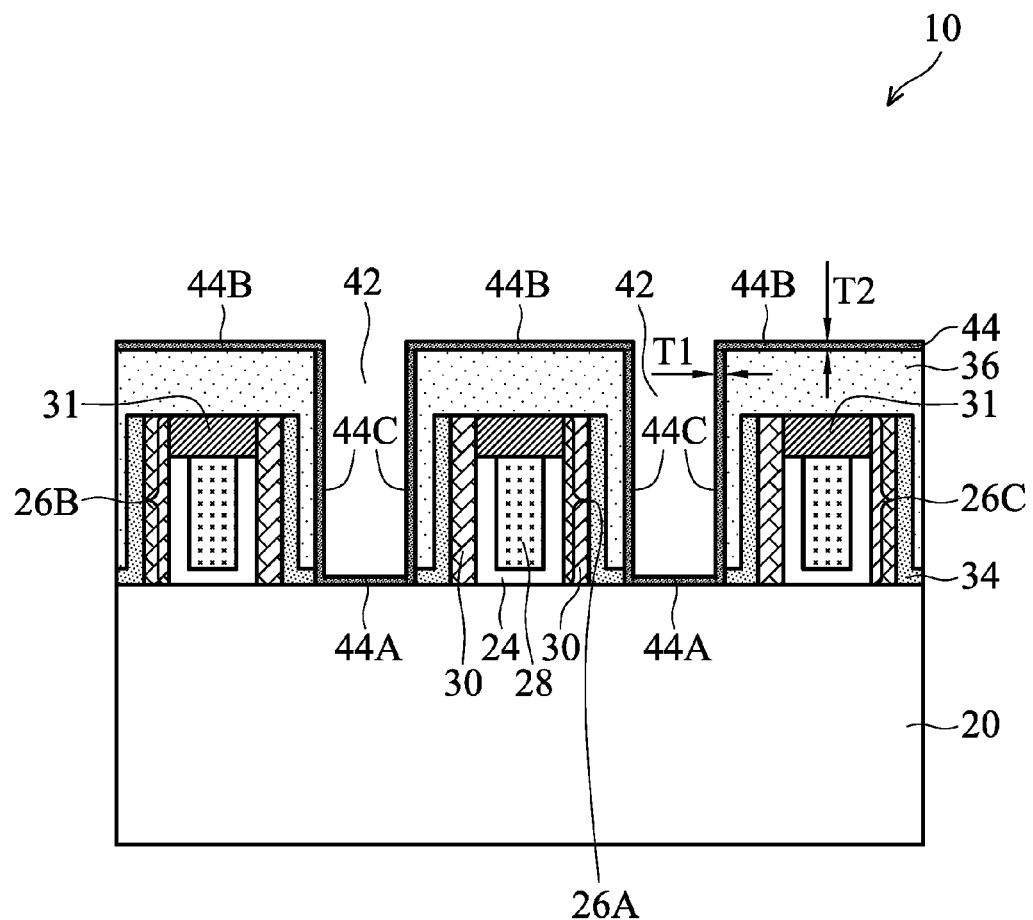
Figure 6:
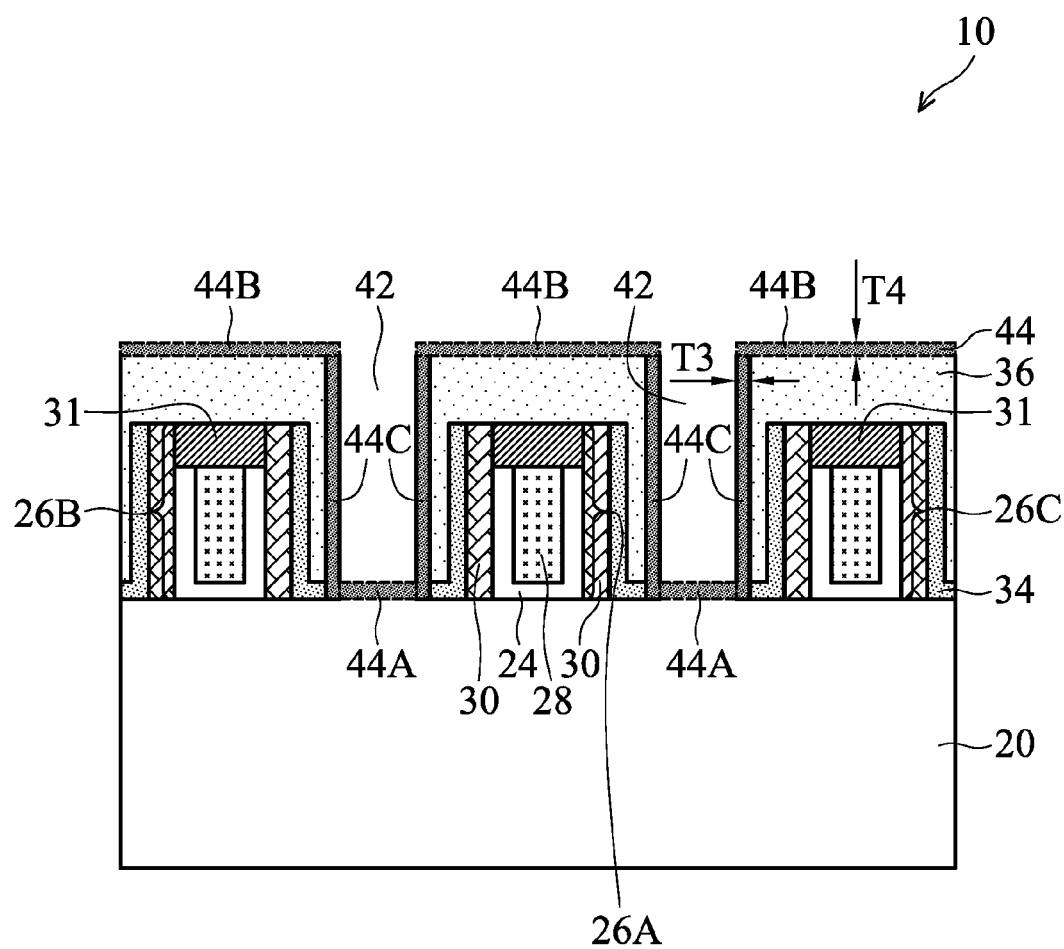
Figure 7:
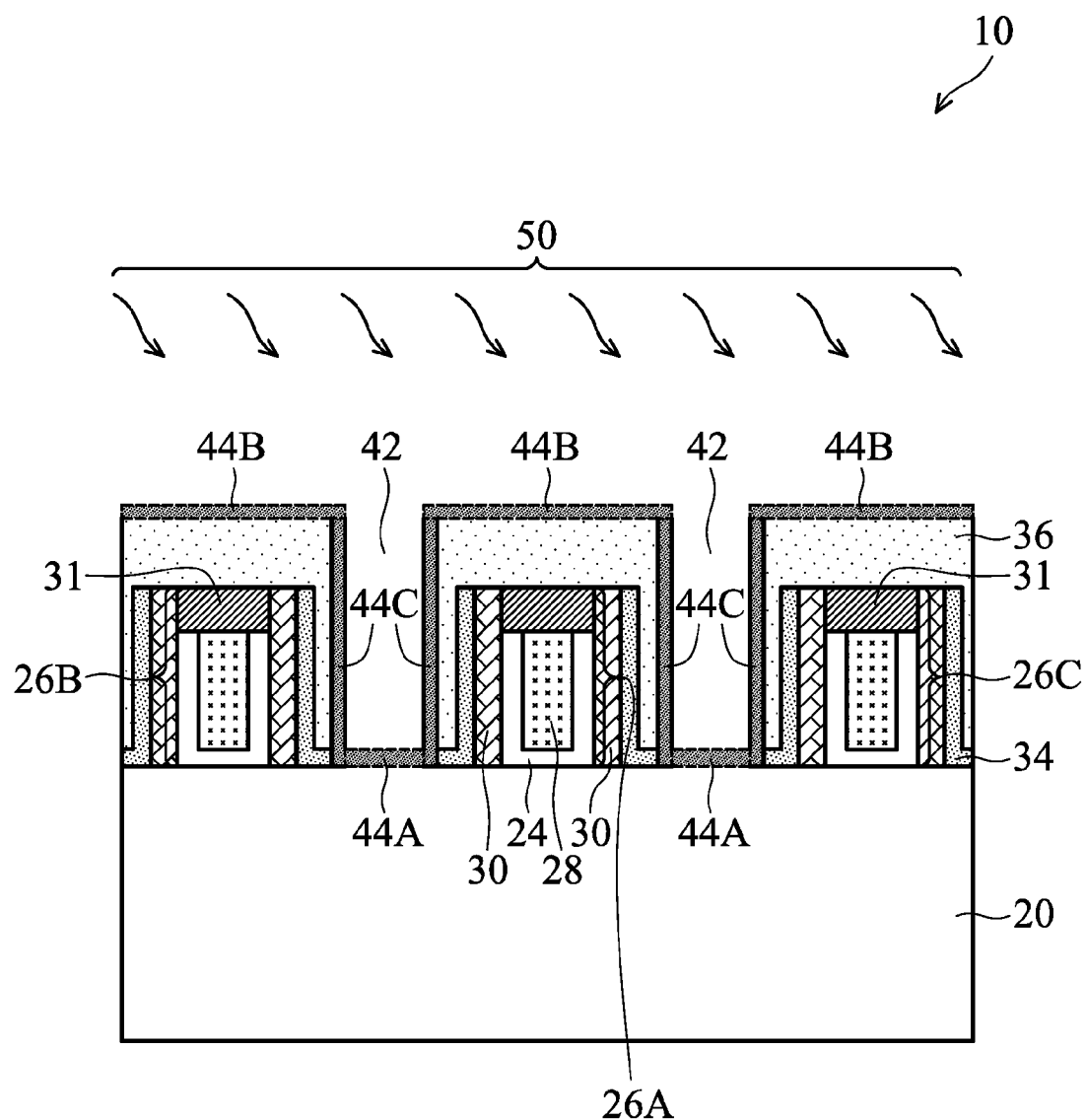
Figure 8:
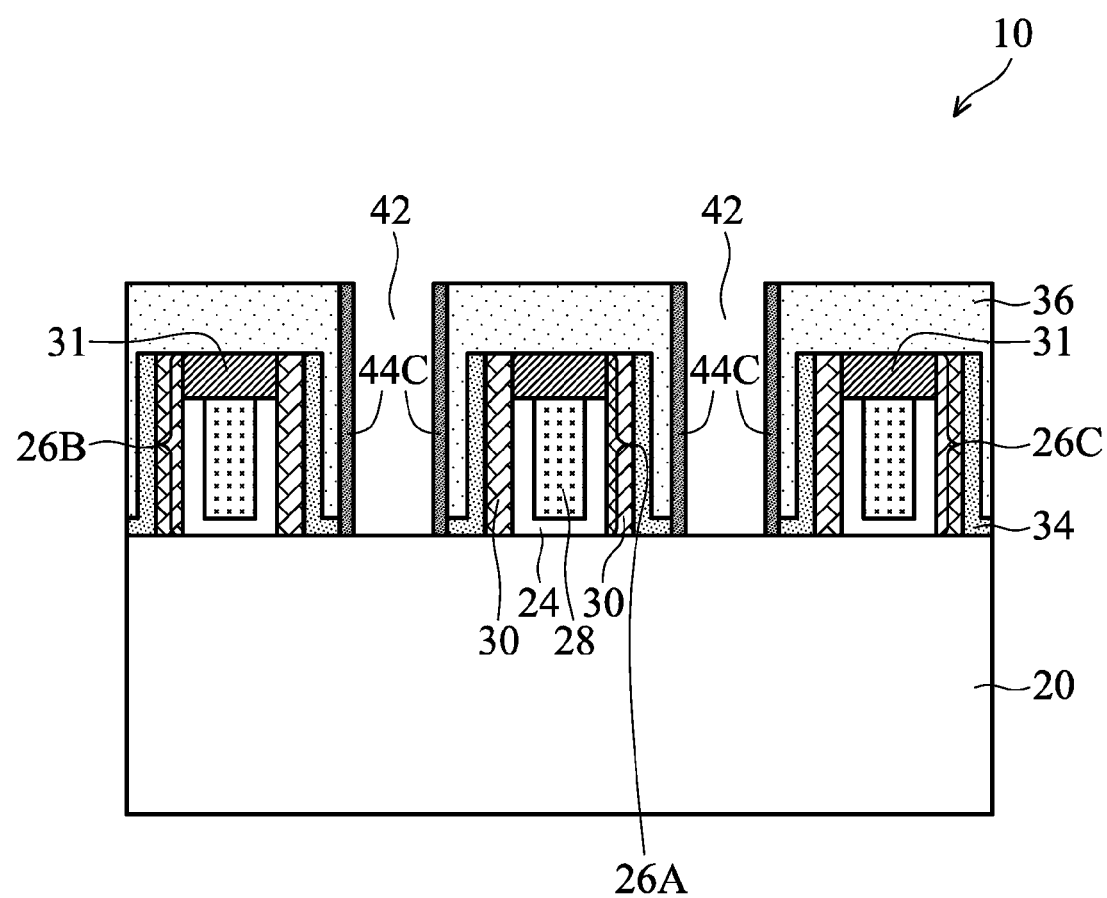

FIGS. 4 and 8 illustrate the formation of contact (plug) spacers. First, as shown in FIGS. 4 through 7, spacer layer 44 is formed. In accordance with some embodiments of the present disclosure, spacer layer 44 is formed of a dielectric material that has a high etching selectivity with oxide, so that in subsequent cleaning processes (in which oxides are removed), the spacers are not damaged. For example, spacer layer 44 may be formed of silicon nitride. The formation includes a plurality of deposition processes and a plurality of bombarding processes.

Referring to FIG. 4, a first sub-layer of spacer layer 44 is deposited. The respective step is shown as step 206 in the process flow shown in FIG. 24. The deposition process is performed using a conformal deposition process such as Atomic Layer Deposition (ALD), Chemical Vapor Deposition (CVD), or the like, so that the horizontal portions and vertical portions of spacer layer 44 have similar thicknesses, for example, with the absolute value of thickness difference (T2−T1) smaller than 20 percent of both thickness T1 of the vertical portions and thickness T2 of the horizontal portions.

Thicknesses T1 and T2 may be as small as possible when the deposition of the first sub-layer concludes. For example, when ALD is used, thicknesses T1 and T2 are equal to the thickness of an atomic layer of the respective material (such as silicon nitride). Alternatively, thicknesses T1 and T2 are equal to several atomic layers, for example, in the range between about 2 atomic layers and 5 atomic layers. When CVD is used, since CVD is not self-stopped, the respective thicknesses T1 and T2 may be in the range between about 5 Å and about 40 Å, for example.

In accordance with some embodiments of the present disclosure, during the deposition of the first sub-layer, plasma is generated from the precursors such as silane ($SiH_4$), ammonia ($NH_3$), $SiCl_2H_2$, and/or the like. During the deposition, nitrogen radicals (N), which are nitrogen atoms that are not charged, are used for the deposition. In accordance with some embodiments of the present disclosure, the plasma generated from the precursors may include both nitrogen ions (N+) and nitrogen radicals, and the nitrogen ions are removed through filtering. Nitrogen radicals are left, and are used to provide the nitrogen atoms for forming silicon nitride.

Figure 5:
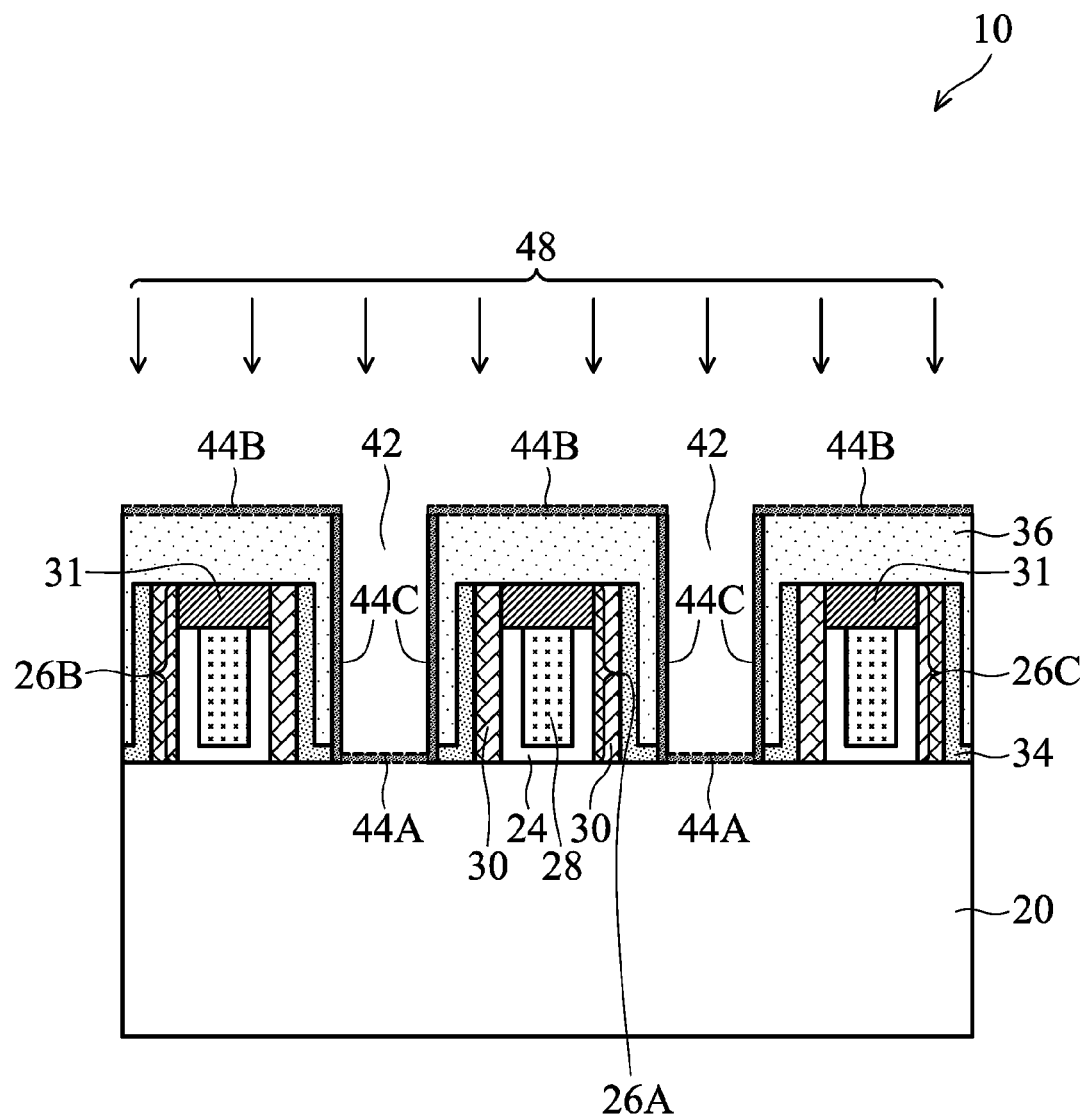

Referring to FIG. 5, after the deposition of the first sub-layer 44, a bombardment (loosening) is performed, and the bombardment is represented by arrow 48. The respective step is shown as step 208 in the process flow shown in FIG. 24. When ALD is used, the bombardment may be performed after the precursors used in the deposition are purged out of the respective deposition chamber. Also, the bombardment may be performed in the same chamber in which the deposition is performed. In accordance with some embodiments of the present disclosure, the bombardment is performed using nitrogen ions. In accordance with alternative embodiments, the bombardment is performed using other elements such as argon. The bombardment direction is perpendicular to the major top surface of wafer 10, and hence is perpendicular to the top surfaces of the horizontal surfaces of spacer layer 44, and is parallel to the major surfaces of the vertical portions of spacer layer 44.

The bombardment is performed using a low energy, and the bombarded portions of spacer layer 44 are loosened, and are neither re-sputtered nor removed. The density of the bombarded portions is reduced. Accordingly, after the bombardment, the material in bottom portions 44A substantially remain in the bottom portion, the material in the top portions 44B substantially remain in the top portion, and the material in the sidewall portions 44C substantially remain in the sidewall portion. This is achieved by selecting an energy for the bombardment to be low enough. Advantageously, the first sub-layer (and the subsequently formed sub-layers) is very thin. As a result, loosening the horizontal portions can be achieved with the ions having a low energy without compromising the effect of loosening, and the loosening effect may be achieved throughout the entireties (from top to bottom) of horizontal portions 44A and 44B. In accordance with some embodiments of the present disclosure, when N+ ions are used for the bombardment, the energy of the N+ ions may be in the range between about 2 eV and about 4.5 eV. It is appreciated that if a high energy is used in the bombardment, although the vertical portions are not subject to the bombarding of the ions directly, the vertical portions are still damaged, and the quality of the vertical portions is degraded. Accordingly, by adopting the embodiments of the present disclosure, the vertical portions 44C are not damaged by the bombardment due to the low energy. Also, as a result of the bombardment, thickness T2 of the horizontal portions 44A and 44B slightly increases due to the reduction of the density.

Throughout the description, the deposition and the bombardment are in combination referred to as a deposition-bombardment cycle. There may be a plurality of deposition-bombardment cycles, each resulting in an additional sub-layer to be formed on the previously formed sub-layers. The plurality of cycles is represented by arrow pointing back to step 206 in the process flow shown in FIG. 24. In each of the deposition-bombardment cycles, a new sub-layer is formed, and is then loosened in the corresponding bombardment. The final spacer layer 44 after all deposition-bombardment cycles are finished has thickness T3 and T4, which may be in the range between about 40 Å and about 60 Å, while greater or smaller thicknesses may be adopted. The resulting structure is shown in FIG. 6.

Table 1 illustrates the exemplary properties of the horizontal portions and the vertical portions of silicon nitride layers formed in accordance with some embodiments of the present disclosure, wherein the results are obtained through experiments. As a comparison, Table 1 also shows the properties of a conventional silicon nitride layer formed using ALD without adopting the bombardment/loosening step.

TABLE 1

| | Density (g/cm$^3$) | Wet etching rate (Å/minute) | Dry etching rate (Å/minute) |
|---|---|---|---|
| Conventional SiN layer | 2.9 | 4.66 | 5.08 |
| Vertical portions | >2.85 | <5.0 | <5.0 |
| Horizontal portions | <2.6 | >150 | >25 |

Referring to Table 1, it is appreciated that the density of the vertical portions of the silicon nitride layers are close to the density of the conventional silicon nitride layer, indicating that the vertical portions are not significantly damaged by the bombardment. The density of the horizontal portions of the silicon nitride layer is much lower than the density of the horizontal portions. This reveals that the properties of the horizontal portions are distinguished from the properties of the vertical portions due to the loosening effect, which is desirable.

Also, the wet etching rates are obtained by etching the silicon nitride films in diluted HF solutions, and the dry etching rates are obtained by etching the silicon nitride films using SiCoNi™ processes, in which a combined gas of ammonia (NH$_3$) and NF$_3$ is used as an etching gas. It is observed that the etching rates (both the wet etching rate and the dry etching rate) of the vertical portions of the silicon nitride layers are close to the respective etching rates of the conventional silicon nitride layers, while the etching rates of the horizontal portions of the silicon nitride layers are much higher. These results indicate that the quality of the vertical portions of the silicon nitride layer is not degraded substantially due to the bombardment, while the horizontal portions are significantly damaged.

FIG. 7 illustrates an isotropic etch on spacer layer 44, wherein the isotropic etch is represented by arrows 50. The respective step is shown as step 210 in the process flow shown in FIG. 24. In accordance with some embodiments of the present disclosure, the isotropic etching is performed using a dry etch process. For example, when spacer layer 44 is formed of silicon nitride, the etching may be performed using a SiCoNi process, wherein the etching gas comprises ammonia (NH$_3$) and NF$_3$. In accordance with alternative embodiments of the present disclosure, the isotropic etch is performed using a wet etching process. For example, when spacer layer 44 is formed of silicon nitride, the etching may be performed using phosphoric acid or diluted HF solution as the etchant. Due to the significant difference in the etching rates of the vertical portions 44C and horizontal portions 44A and 44B, horizontal portions 44A and 44B are removed, while vertical portions 44C remain, although vertical portions 44C may be thinned slightly. The remaining vertical portions 44C are referred to as contact plug spacers 44C hereinafter. The resulting structure is shown in FIG. 8. Each of contact plug spacers 44C forms a full ring when viewed from the top of wafer 10.

Figure 9:
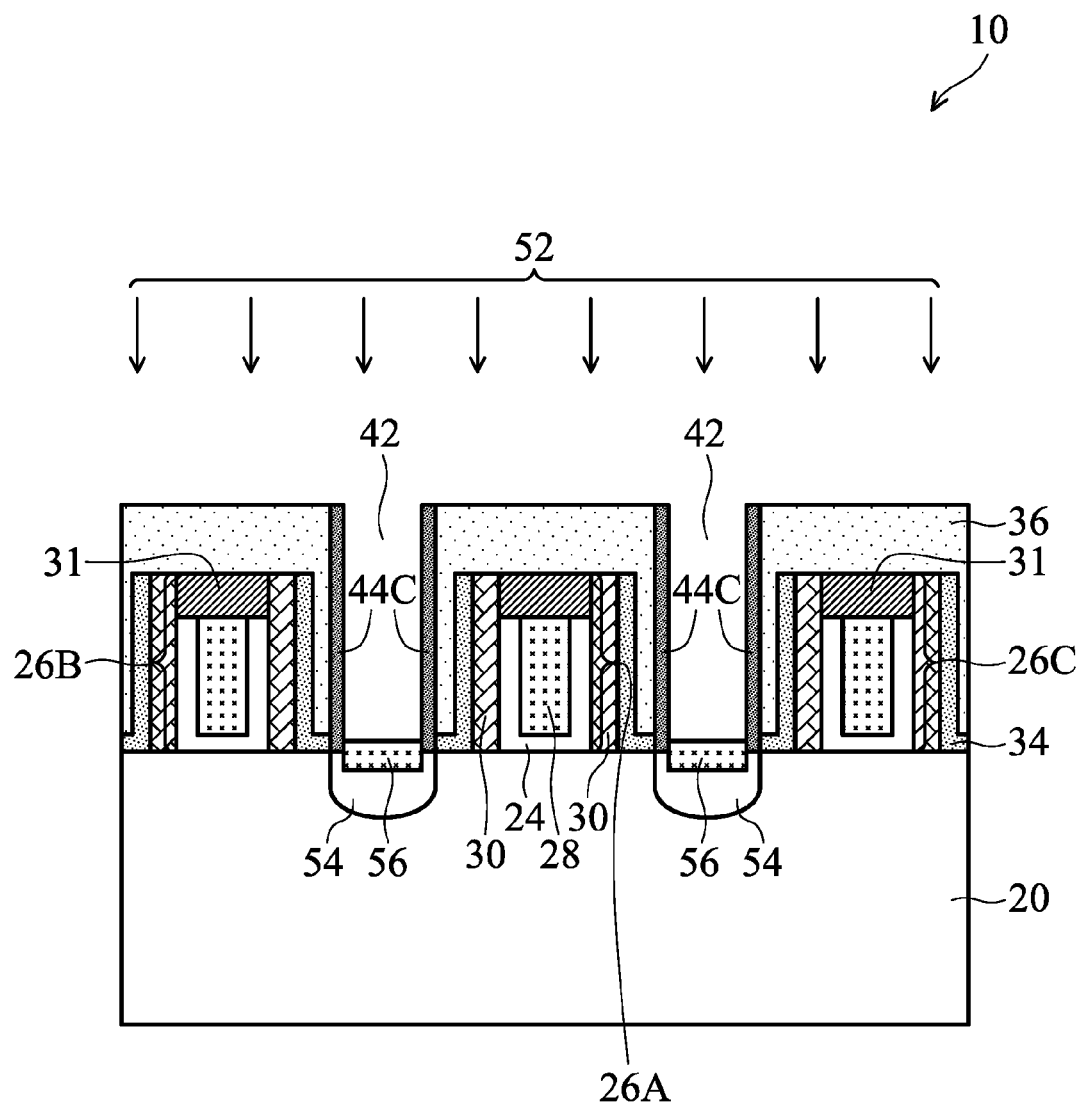

FIG. 9 also illustrates a Pre-Amorphization Implantation (PAI) and a source/drain implantation, which are illustrated by arrows 52. The respective step is shown as step 212 in the process flow shown in FIG. 24. The PAI may be performed using germanium, silicon, or the like, which destroys the lattice structure of the implanted regions in order to control the depth of the subsequent source/drain implantation. The implantation may be performed using boron or indium if the respective transistor is a p-type transistor, or using phosphorous, arsenic, or antimony if the respective transistor is an n-type transistor. The respective source/drain regions 54 are illustrated in FIG. 9.

In accordance with some embodiments of the present disclosure, source/drain silicide regions 56 are formed on the top surfaces of source/drain regions 54. The formation process may include forming a blanket metal layer (not shown), performing an anneal to react the metal layer with the surface portions of source/drain regions 54, and removing the un-reacted portions of the metal layer.

Figure 10:
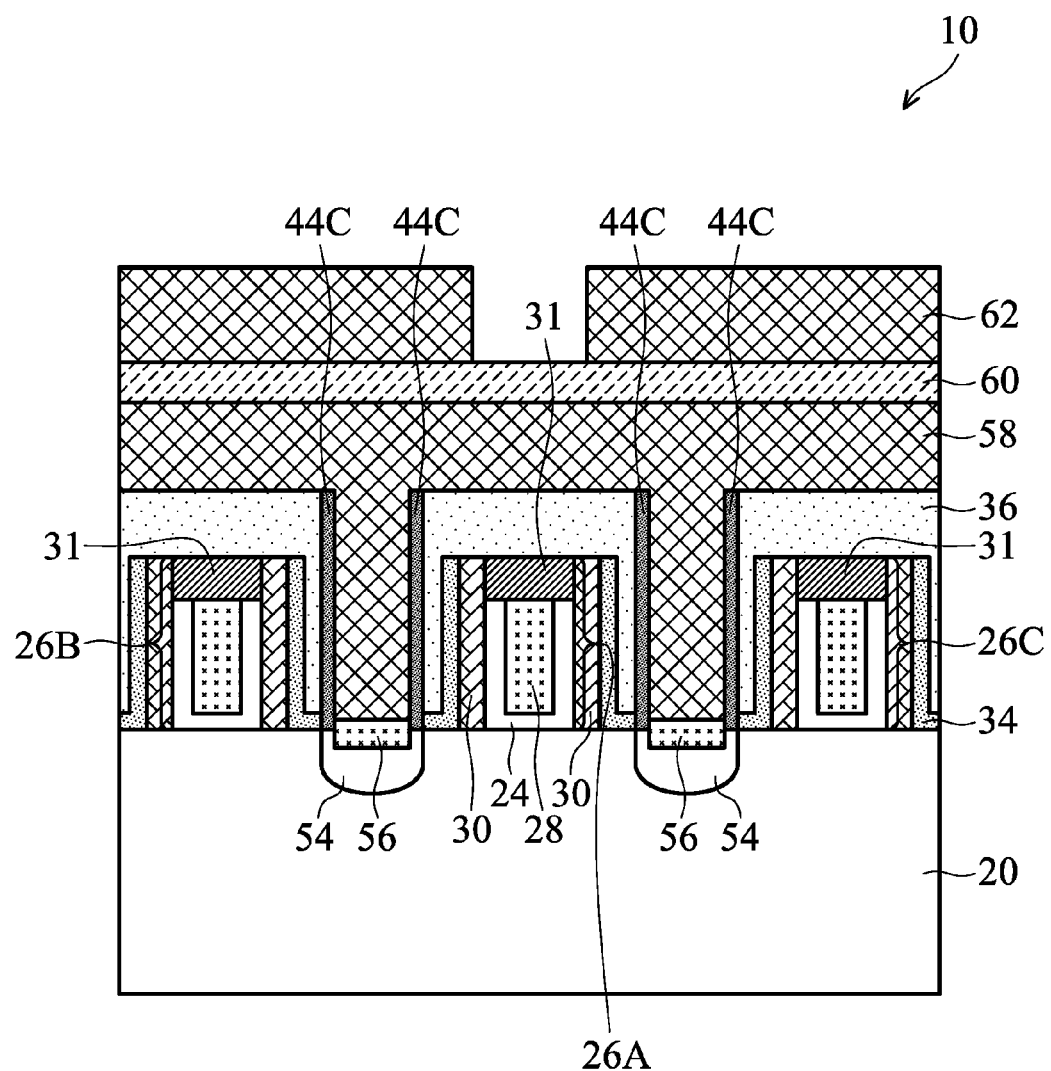
Figure 11:
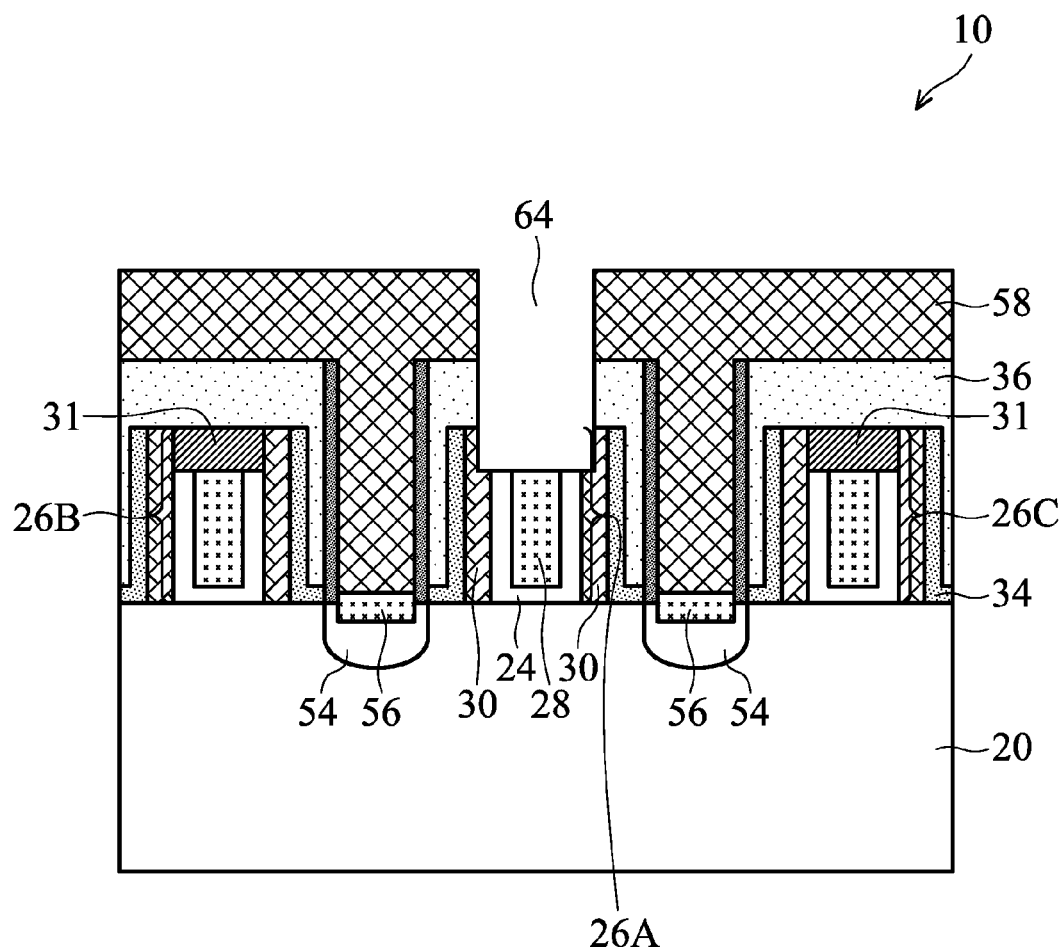
Figure 12:
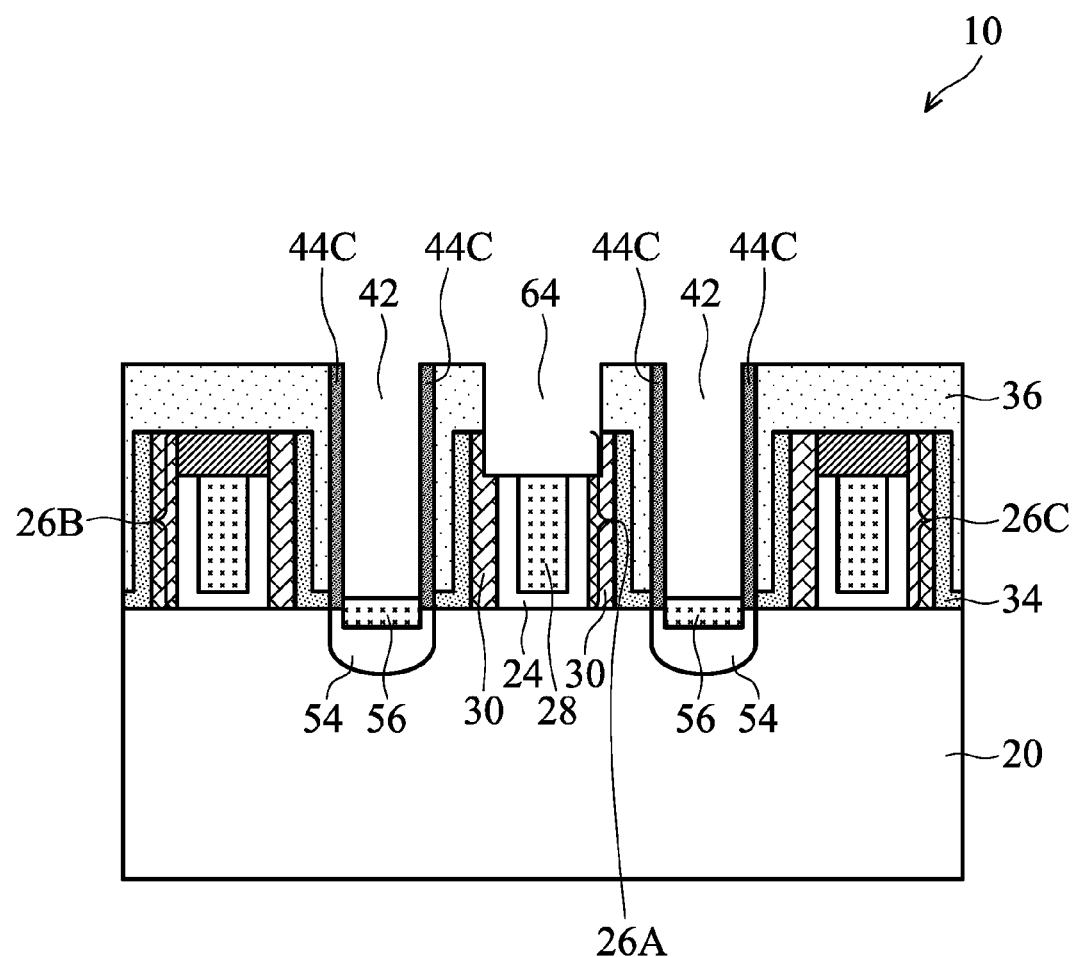

FIGS. 10 through 12 illustrate the formation of a gate contact opening in accordance with some embodiments of the present disclosure, wherein a tri-layer is used. Referring to FIG. 10, photo resist 58 (bottom layer) is formed to fill openings 42 (FIG. 9). Middle layer 60 is then formed over bottom layer 58, followed by the formation and the patterning of upper layer 62 in a lithography process. The respective step is shown as step 214 in the process flow shown in FIG. 24. In accordance with some embodiments of the present disclosure, middle layer 60 is formed of an inorganic material, and upper layer 62 is formed of photo resist. Next, as shown in FIG. 11, the patterns of the patterned upper layer 62 is transferred down into middle layer 60 (FIG. 10), and into bottom layer 58. ILD 36 and mask layer 31 (FIG. 10) are then etched to form opening 64, through which gate electrode 28 is exposed. The respective step is shown as step 216 in the process flow shown in FIG. 24. Upper layer 62 and middle layer 60 are consumed during the etching. Next, bottom layer 58 is removed in an ashing process, and the resulting structure is shown in FIG. 12.

Figure 13:
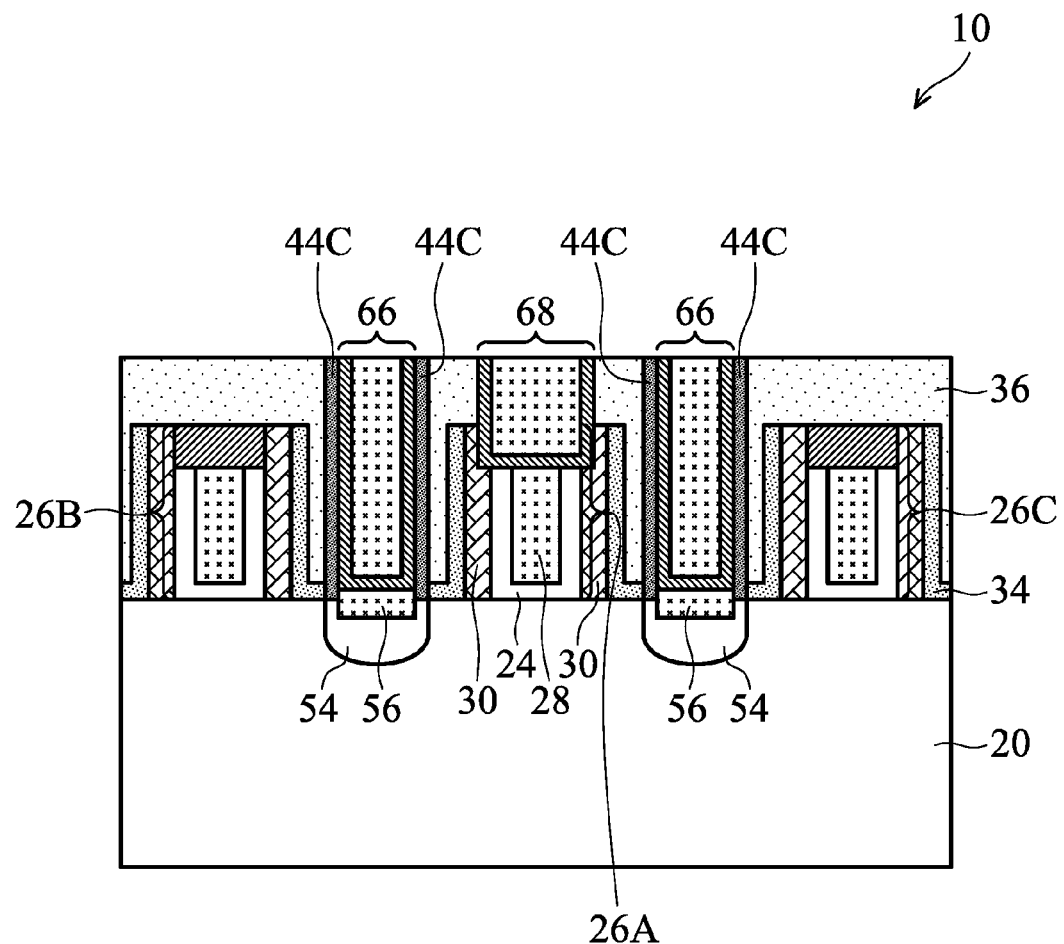

FIG. 13 illustrates the formation of source/drain contact plugs 66 and gate contact plug 68. The respective step is shown as step 218 in the process flow shown in FIG. 24. Each of contact plugs 66 and 68 may include an adhesion/barrier layer, and a metallic material over the adhesion/barrier layer. The adhesion/barrier layer may be formed of a material selected from titanium, titanium nitride, tantalum, tantalum nitride, combinations thereof, or multi-layers thereof. The metallic material may be formed of tungsten, copper, aluminum, or a metal alloy, for example. The formation process may include filling the openings with a blanket adhesion/barrier layer and the metallic material into openings 42 and 64 (FIG. 12), and performing a CMP to remove the excess portions of the blanket barrier layer and the metallic material.

Figure 14:
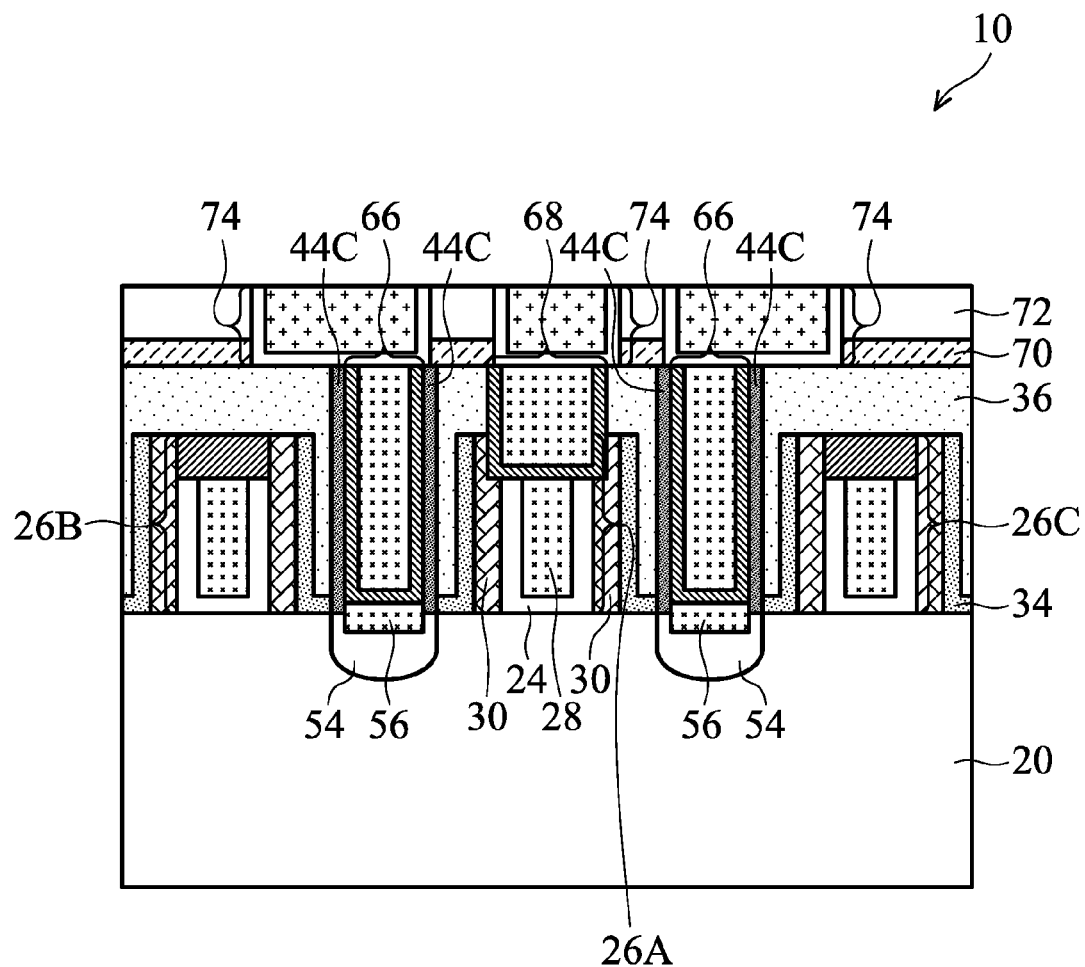

FIG. 14 illustrates the formation of etch stop layer 70, dielectric layer 72, and conductive features 74. In accordance with some embodiments of the present disclosure, conductive features 74 are metal lines, and dielectric layer 72 is an Inter-Metal Dielectric (IMD). In accordance with alternative embodiments, conductive features 74 are upper contact plugs, and dielectric 72 is an upper ILD (as compared to lower ILD 36).

FIGS. 15 through 22 illustrate cross-sectional views of intermediate stages in the formation of a transistor and contact plugs in accordance with some embodiments of the present disclosure. Unless specified otherwise, the materials and the formation methods of the components in these embodiments are essentially the same as the like components, which are denoted by like reference numerals in the embodiments shown in FIGS. 1 through 14. These embodiments are similar to the embodiments in FIGS. 1 through 14, except the contact plug spacers are also formed for gate contact plugs in addition to source/drain contact plugs. Accordingly, the contact plug spacers are formed after both source/drain contact openings and source/drain contact openings are formed. The details regarding the formation process and the materials of the components shown in FIGS. 15 through 22 may thus be found in the discussion of the embodiments shown in FIGS. 1 through 14.

Figure 2:
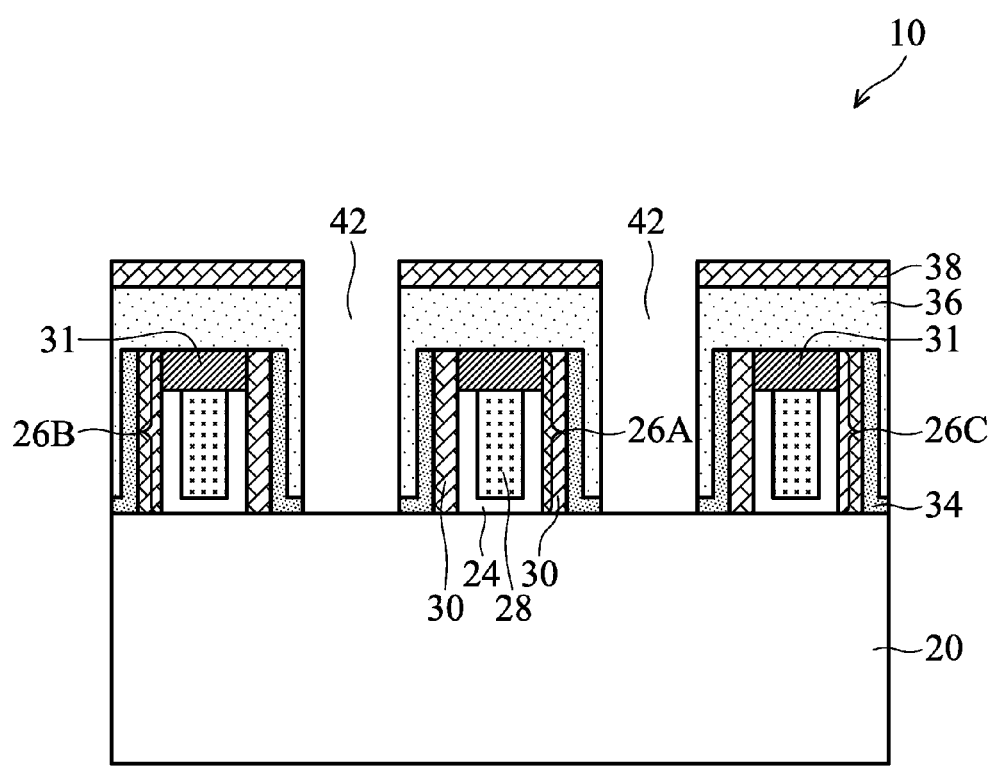
Figure 3:
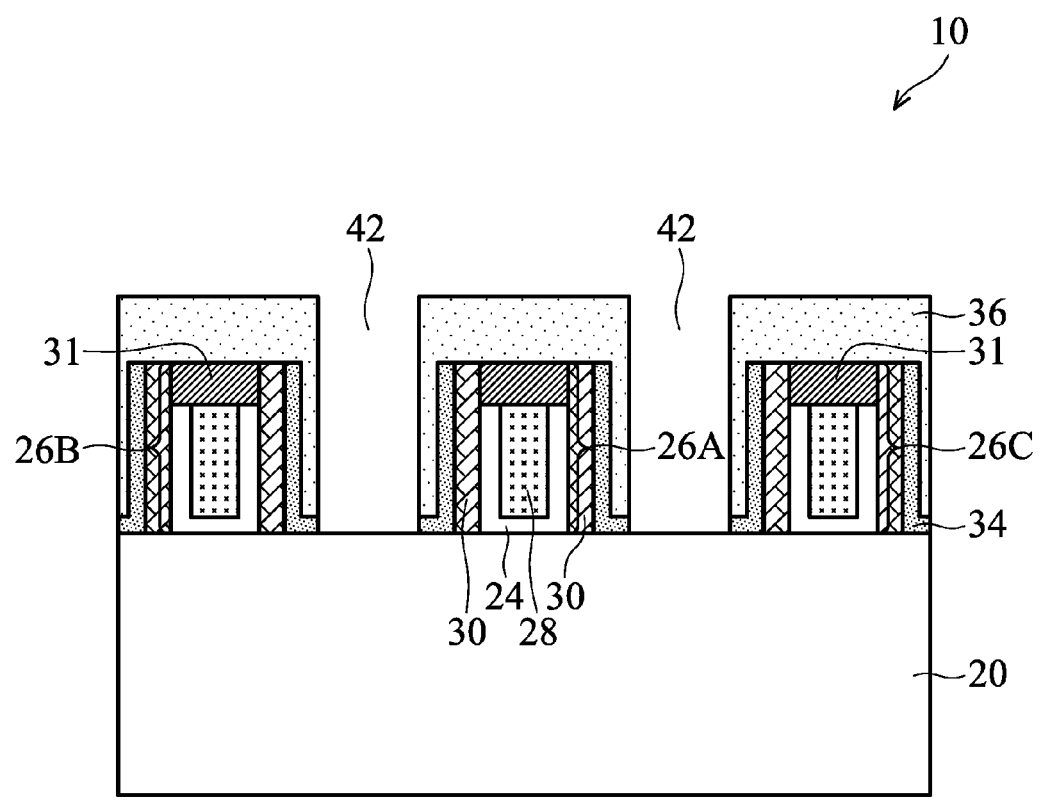
Figure 15:
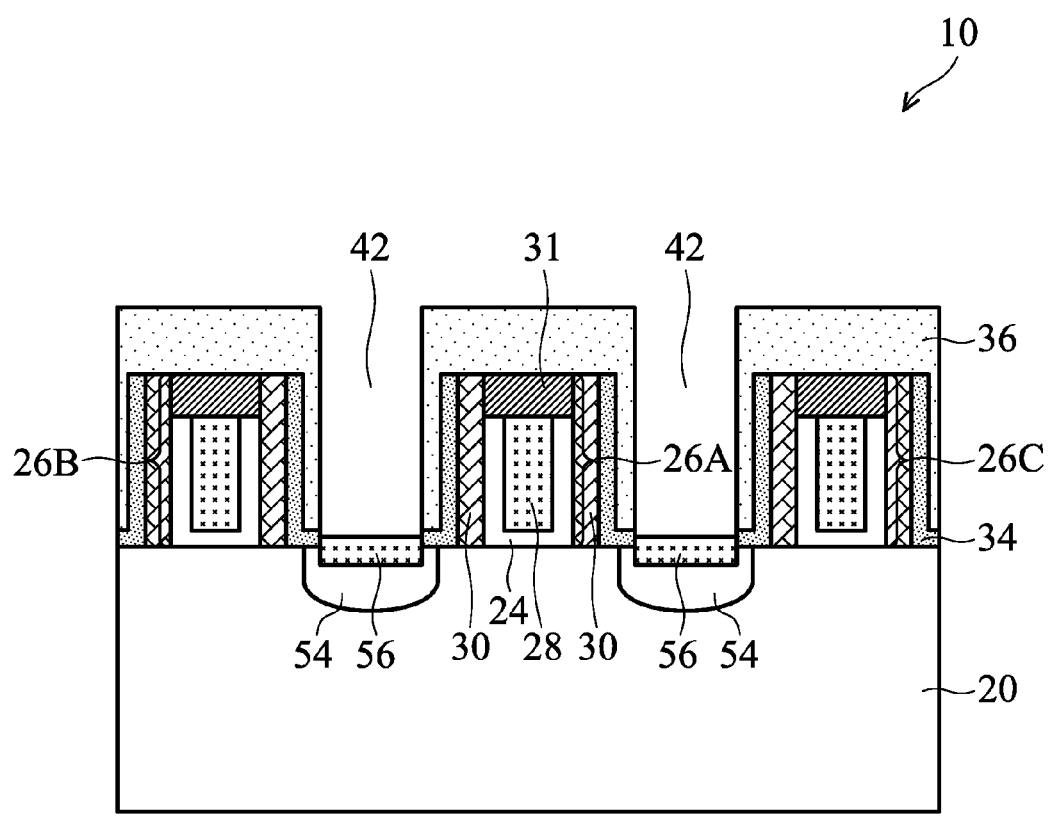
FIGS. 15 through 22 are cross-sectional views of intermediate stages in the formation of a transistor in accordance with some embodiments.

The initial steps of these embodiments are essentially the same as shown in FIGS. 1 through 3. Next, the steps as discussed for FIGS. 8 and 9 are performed to perform the PAI, and to form source/drain regions 54 and source/drain silicide regions 56. The resulting structure is shown in FIG. 15.

Figure 16:
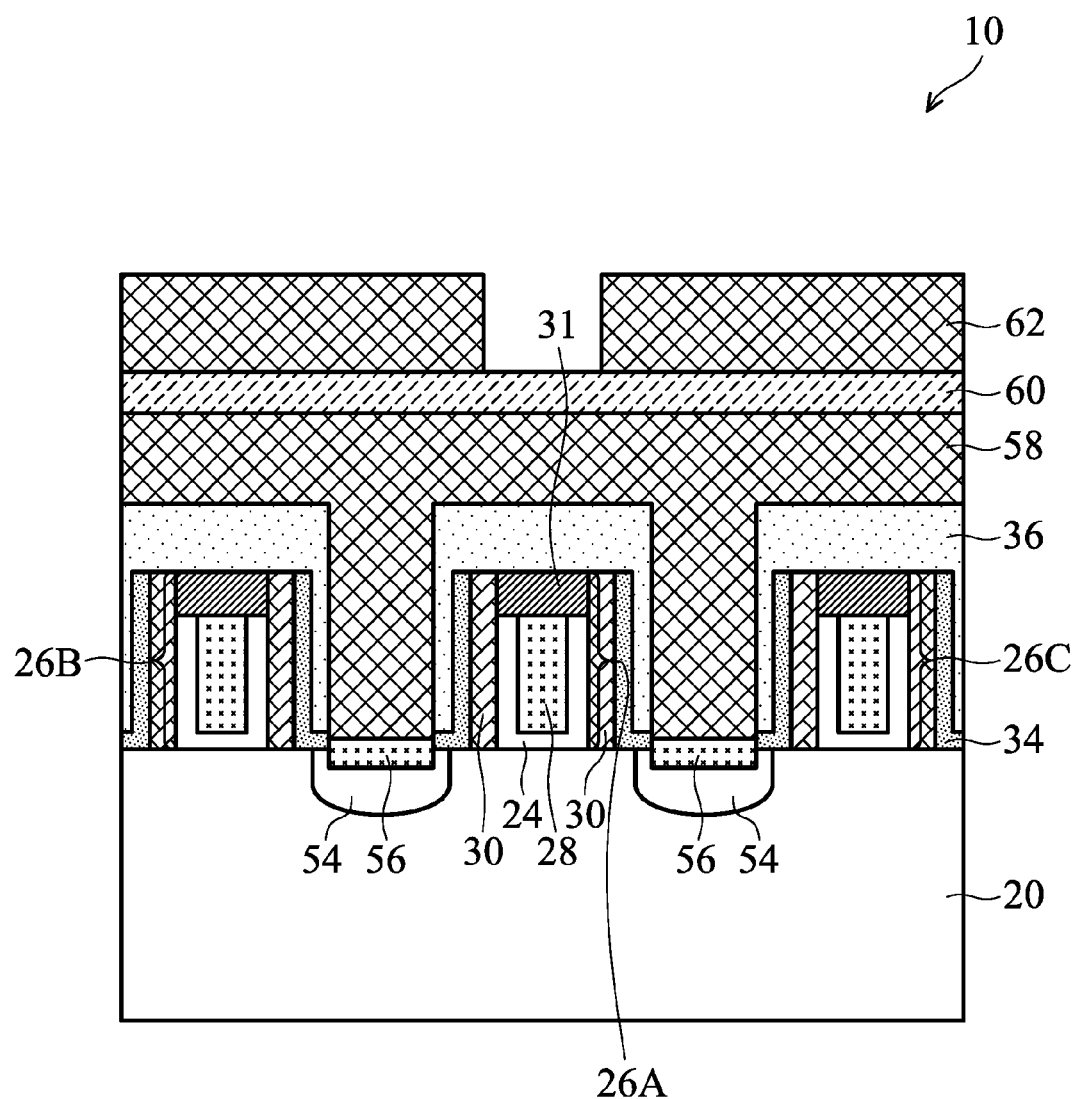

In a subsequent step, as shown in FIG. 16, the tri-layer including photo resist 58, inorganic layer 60 and photo resist 62 is formed. Photo resist 62 is patterned through light exposure and development steps to form an opening overlapping gate stack 26A.

Figure 17:
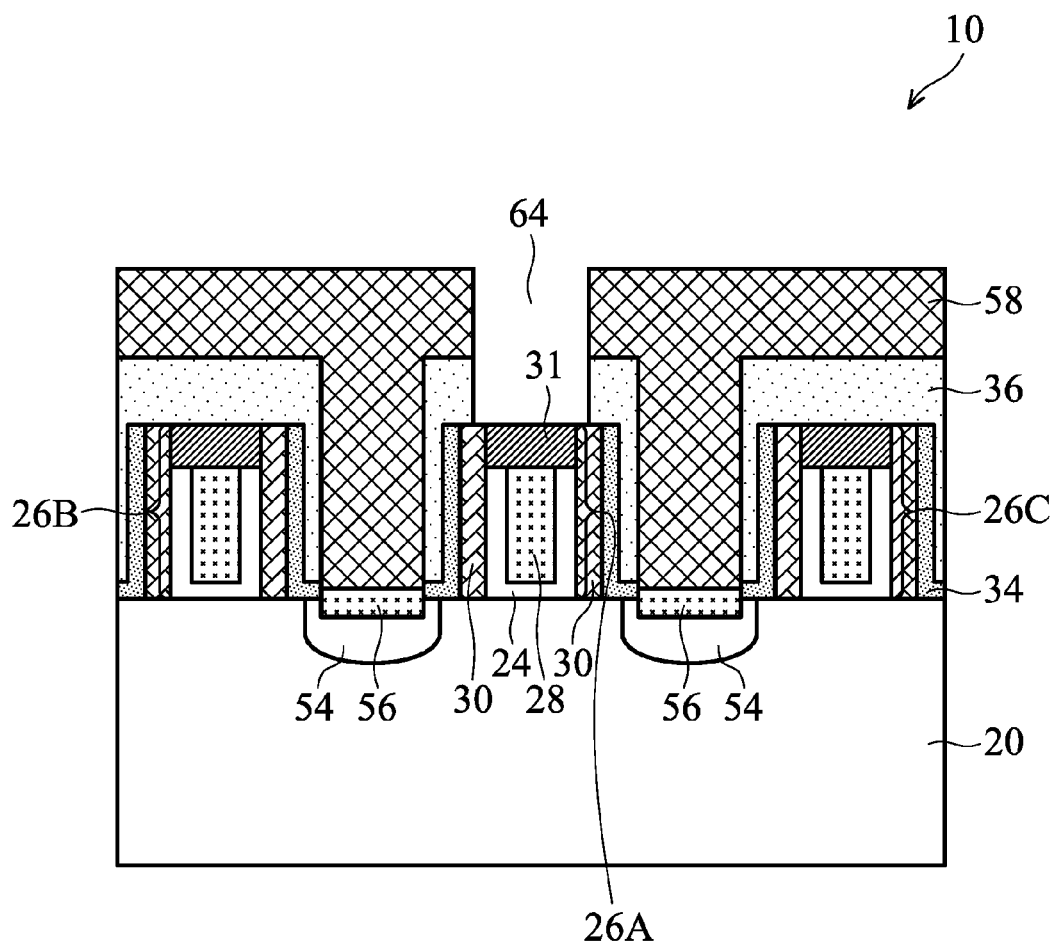
Figure 18:
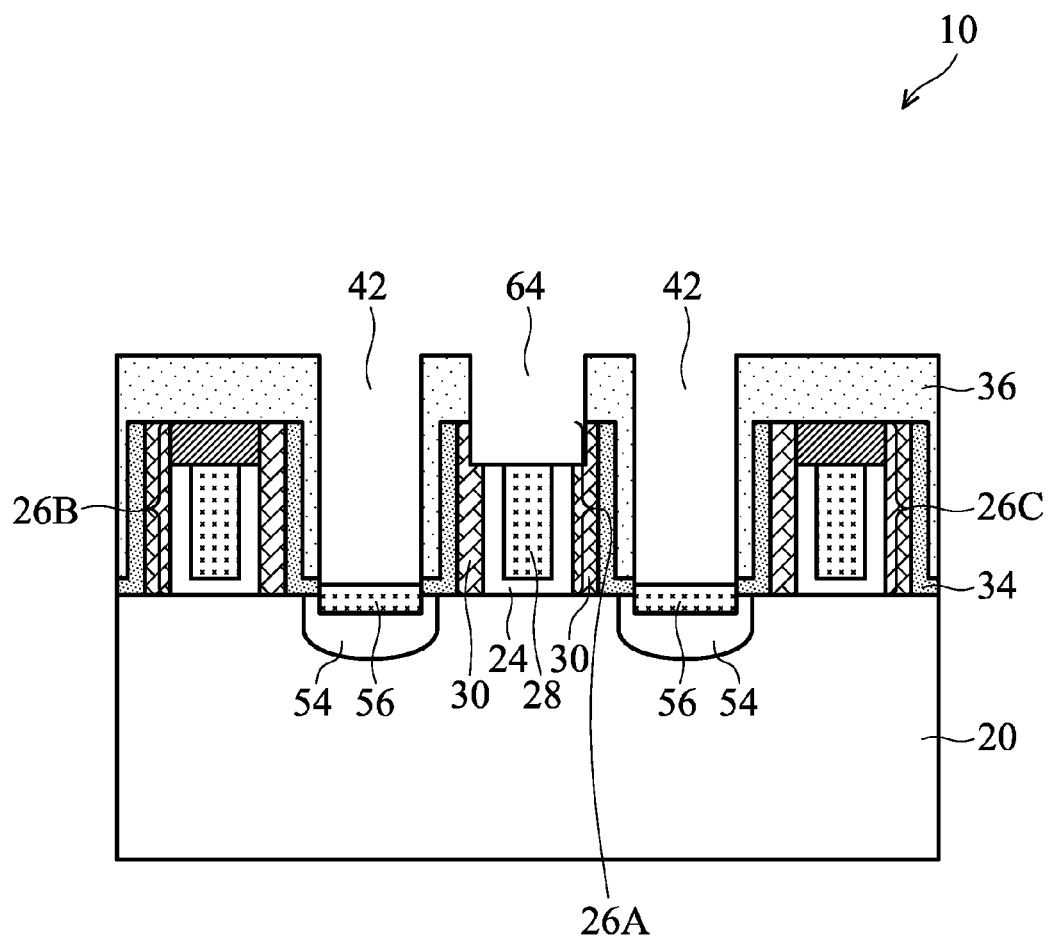

Next, the patterned upper layer 62 is used as an etching mask to extend the opening in photo resist 62 into middle layer 60, and into bottom layer 58, as shown in FIG. 17. ILD 36 and mask layer 31 are then etched to form opening 64 (FIG. 17), through which gate electrode 28 in gate stack 26A is exposed. Upper layer 62 and middle layer 60 are consumed during the etching. Next, bottom layer 58 is removed in an ashing process, and the resulting structure is shown in FIG. 18.

Figure 19:
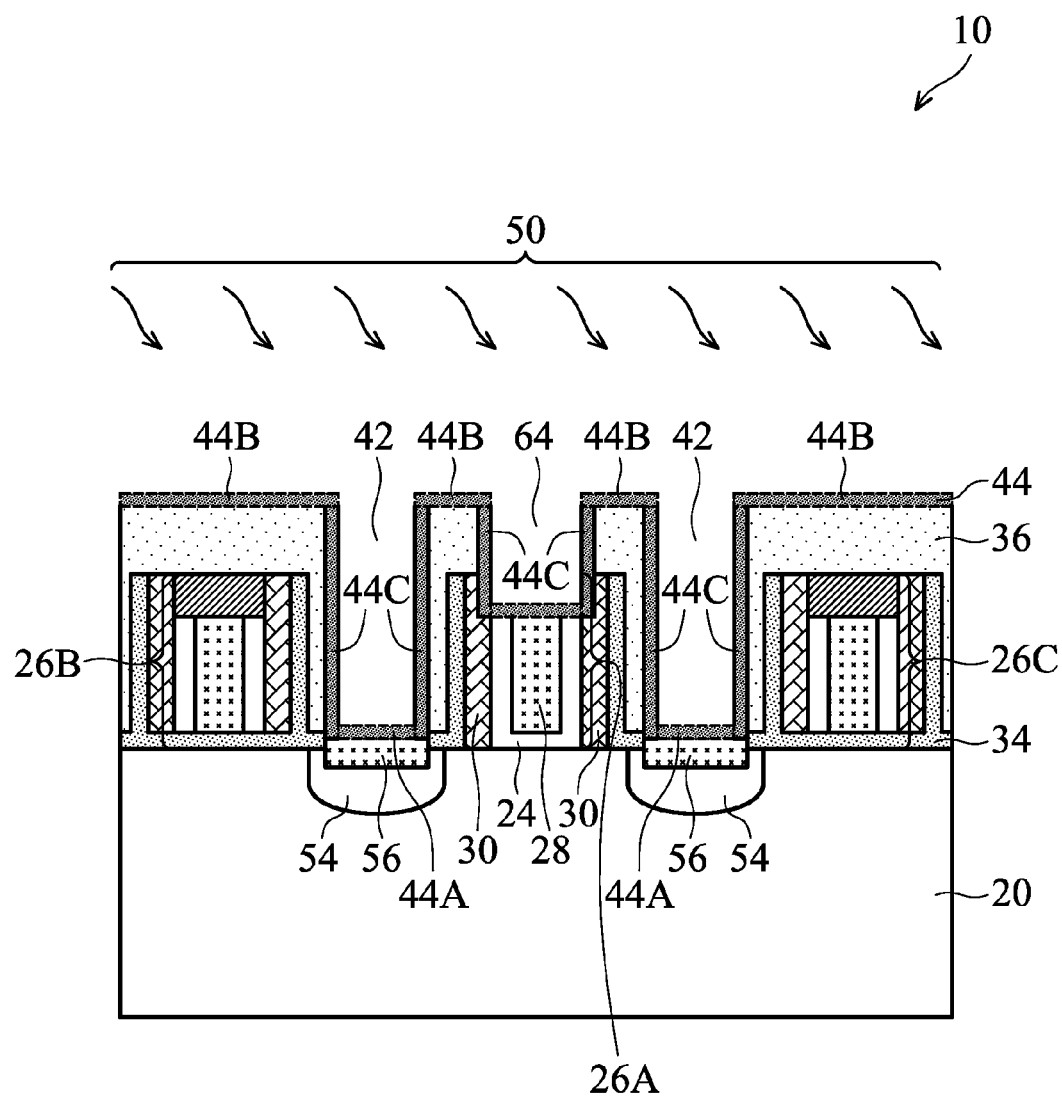
Figure 20:
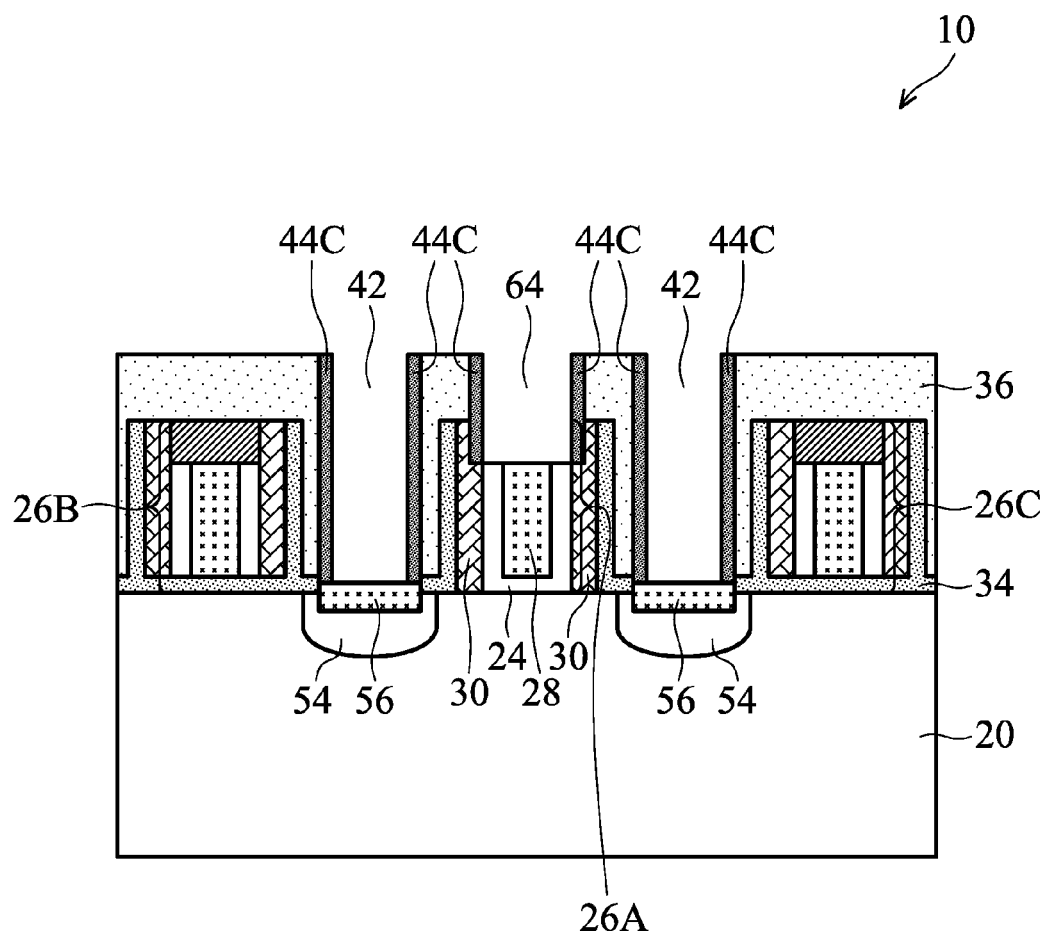

Referring to FIG. 19, spacer layer 44 is formed as a blanket layer, which includes bottom horizontal portions 44A, top horizontal portions 44B, and vertical horizontal portions 44C. In accordance with some embodiments of the present disclosure, spacer layer 44 also extends into gate contact opening 64 in additional to extending into source/drain contact openings 42. Horizontal portions 44A and 44B are loosened, and vertical portions 44C are not loosened. The formation of spacer layer 44 is essentially the same as described for FIGS. 4 through 7, which includes a plurality of deposition-and-bombardment cycles. As shown in FIG. 19, isotropic etching 50 is performed on spacer layer 44. Horizontal portions 44A and 44B are thus removed by etching, and the majority of vertical portions 44C remain after the isotropic etching as contact plug spacers. The remaining structure is shown in FIG. 20. In accordance with these embodiments, gate opening 64 also has contact plug spacer 44C formed therein.

Figure 21:
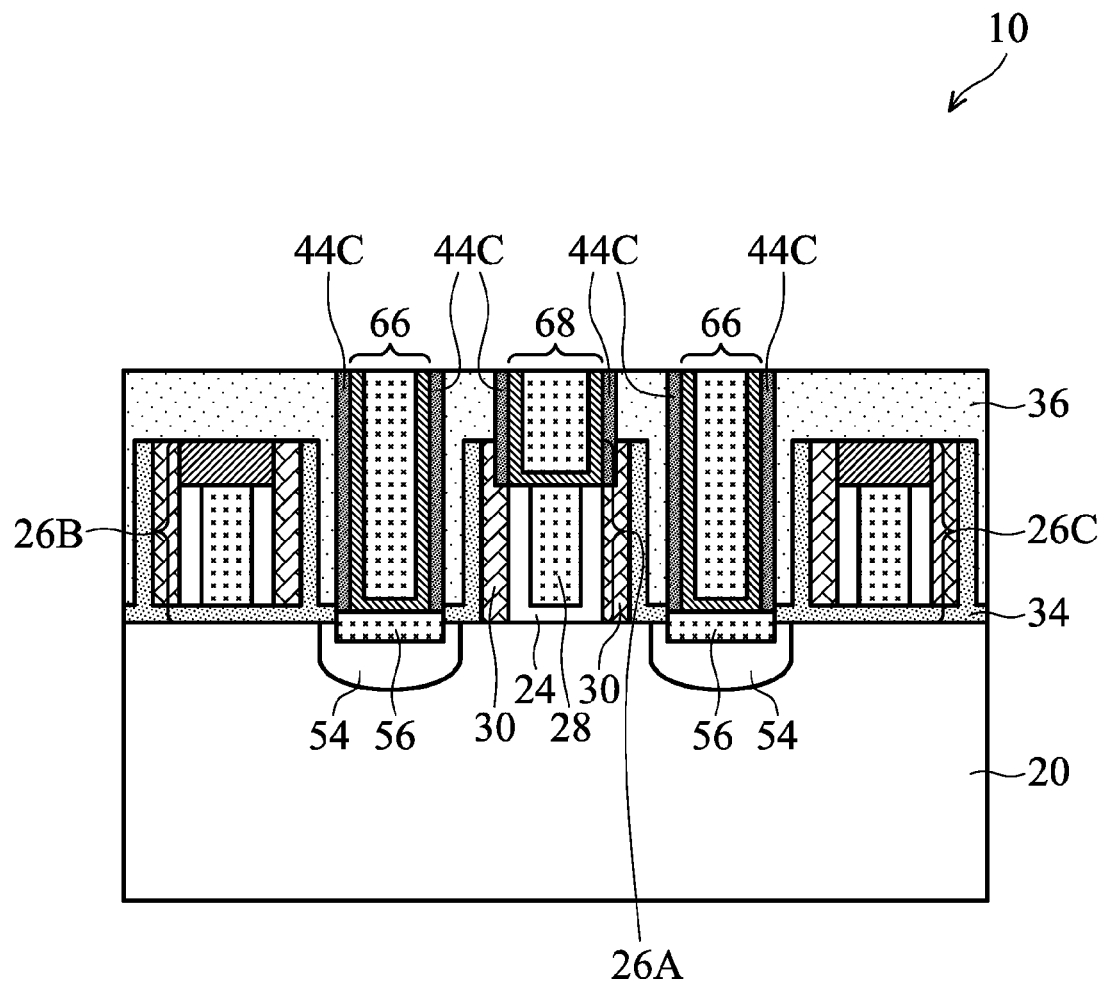
Figure 22:
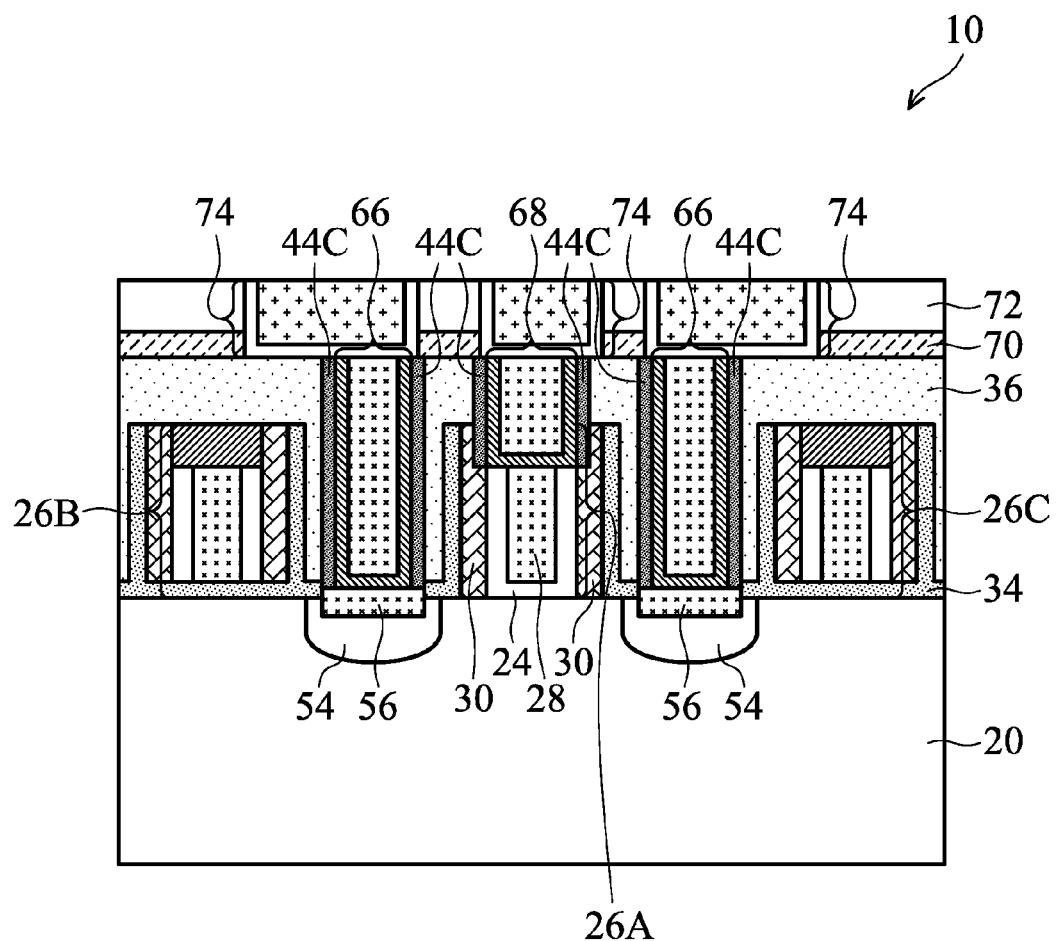

Referring to FIG. 21, gate contact plug 68 and source/drain contact plugs 66 are formed. In the top view of wafer 10, each of gate contact plug 68 and source/drain contact plugs 66 is encircled by one of contact plug spacer ring 44C, which is a full ring without break in the top view. Contact spacers 44C have the function of reducing the leakage current flowing between contact plugs and the adjacent conductive features. FIG. 22 illustrates the formation of etch stop layer 70, dielectric layer 72, and conductive features 74.

Figure 23:
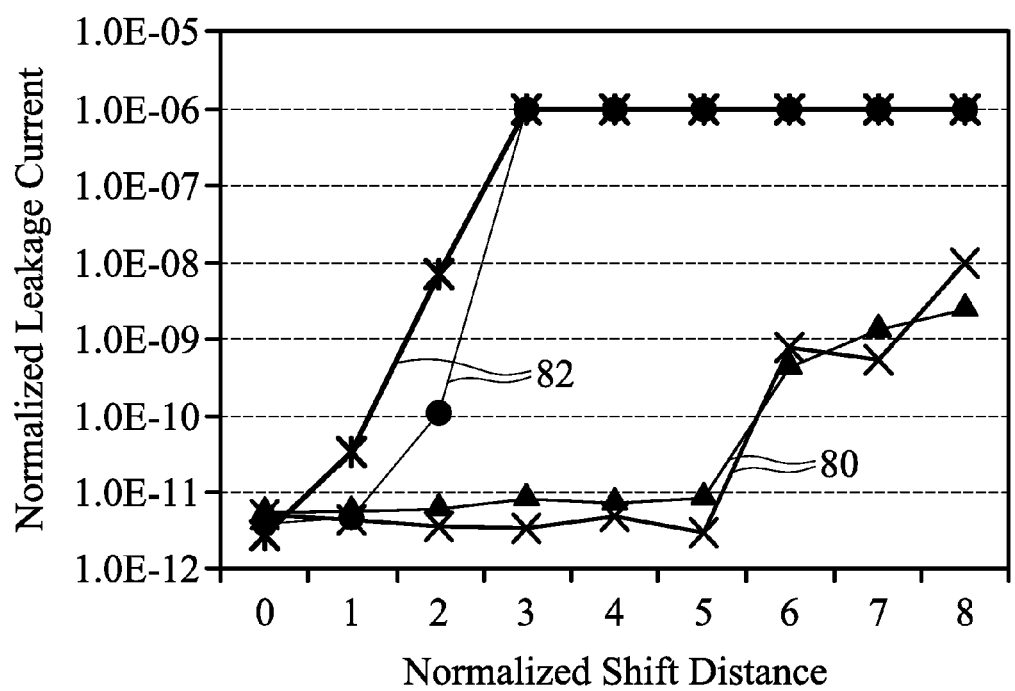
FIG. 23 illustrates the comparison of the performance data of a transistor formed in accordance with some embodiments of the present disclosure and the performance data of a transistor formed using a conventional method.

The embodiments of the present disclosure have some advantageous features. FIG. 23 illustrates experiments results obtained from sample wafers, wherein the X axis represents the normalized shifting (overlay shift) distance of source/drain contact plug 66 (FIG. 14) toward gate stack 26A. The Y axis represents the normalized leakage current. Clearly, when source/drain contact plug 66 is closer to gate stack 26A, the leakage current between them may increase due to less isolation in between. Accordingly, the quality of spacers 44C plays a more important role than if there is no overlay shift. Lines 80 are obtained from the sample structures made in accordance with the embodiments of the present disclosure, and lines 82 are obtained from the sample structures obtained by forming a blanket SiN spacer layers, and then using high-energy plasm (anisotropic etching) to remove the horizontal portions of the blanket SiN spacer layers, leaving vertical portions as spacers.

The experiment results indicate that for lines 80, the leakage currents increase only when the normalized shifting distance is greater than 5 (normalized distance) or higher. As a comparison, for lines 82, the leakage currents start to increase when the normalized shifting distance is greater than 1. Accordingly, the formation process of contact plug spacers using anisotropic etching has smaller process window than the process in accordance with the embodiments of the present disclosure. Furthermore, the leakage currents represented by lines 80 are three orders lower than the leakage currents represented by lines 82, which proves that the function of the non-damaged spacers 44C for reducing leakage currents is not compromised by the isotropic etch, while the function of the contact plug spacers formed using conventional high-energy plasma etch is compromised.

Experiment results also reveal that when multiple SiCoNi™ processes are performed on the structure shown in FIG. 8 or FIG. 20, the lateral dimensions of openings 42 and 64 are not enlarged. This indicates that the spacers formed in accordance with the embodiments of the present disclosure are not prone to oxidation, and their etching selectivity over oxide may remain high.

In accordance with some embodiments of the present disclosure, a method includes etching a dielectric layer to form an opening, with a component of a transistor being exposed through the opening. A spacer layer is formed, and includes a horizontal portion at a bottom of the opening, and a vertical portion in the opening. The vertical portion is on a sidewall of the dielectric layer. An isotropic etch is performed on the spacer layer to remove the horizontal portion, and the vertical portion remains after the isotropic etch. The remaining vertical portion forms a contact plug spacer. A conductive material is filled into the opening to form a contact plug.

In accordance with some embodiments of the present disclosure, a method includes etching a dielectric layer to form an opening, with a component of a transistor being exposed through the opening A spacer layer is formed through a process including a plurality of cycles, and each of the cycles includes depositing a sub-layer of the spacer layer, and bombarding the sub-layer to loosen a horizontal portion of the sub-layer. The horizontal portion is at a bottom of the opening. The method further includes removing the horizontal portions of the sub-layers formed by the plurality of cycles, and filling a conductive material into the opening to form a contact plug, wherein a vertical portion of the spacer layer encircles the contact plug.

In accordance with some embodiments of the present disclosure, a method includes forming an ILD to cover a gate stack, etching the ILD to form a source/drain contact opening, implanting a semiconductor substrate through the source/drain contact opening to form a source/drain region, forming a blanket spacer layer to extend into the source/drain contact opening, and performing an isotropic etch on the blanket spacer layer to remove a portion of the blanket spacer layer in the source/drain contact opening. A remaining portion of the blanket spacer layer in the source/drain contact opening forms a contact plug spacer. A conductive material is filled into the source/drain contact opening to form a source/drain contact plug, wherein the source/drain contact plug is encircled by the contact plug spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a dielectric layer to form an opening, wherein a component of a transistor is exposed through the opening;
   forming a spacer layer comprising:
      a horizontal portion at a bottom of the opening; and
      a vertical portion in the opening, wherein the vertical portion is on a sidewall of the dielectric layer;
   performing an isotropic etch on the spacer layer to remove the horizontal portion, and the vertical portion remains after the isotropic etch, and the remaining vertical portion forms a contact plug spacer; and
   filling a conductive material into the opening to form a contact plug.

2. The method of claim 1, wherein the forming the spacer layer comprises:
   depositing a sub-layer of the spacer layer; and
   bombarding the sub-layer to loosen the sub-layer.

3. The method of claim 2, wherein during the bombarding, materials of the horizontal portion are loosened and remain at the bottom of the opening.

4. The method of claim 2, wherein the forming the spacer layer is performed using atomic layer deposition, and the bombarding is performed after each atomic layer of the spacer layer is formed.

5. The method of claim 1, wherein in the isotropic etch, the horizontal portion has a higher etching rate than the vertical portion.

6. The method of claim 1, wherein the component of the transistor comprises a source/drain region, a source/drain silicide region, or a gate electrode.

7. The method of claim 1, wherein the forming the spacer layer comprises forming a silicon nitride layer.

8. A method comprising:
   etching a dielectric layer to form an opening, wherein a component of a transistor is exposed through the opening;
   forming a spacer layer comprising a plurality of cycles, and each of the cycles comprises:
      depositing a sub-layer of the spacer layer; and
      bombarding the sub-layer to loosen a horizontal portion of the sub-layer, wherein the horizontal portion is at a bottom of the opening;
   removing the horizontal portions of the sub-layers formed by the plurality of cycles; and
   filling a conductive material into the opening to form a contact plug, wherein a vertical portion of the spacer layer encircles the contact plug.

9. The method of claim 8, wherein during the bombarding, materials of the horizontal portion are loosened and remain at the bottom of the opening.

10. The method of claim 8, wherein the forming the spacer layer is performed using atomic layer deposition, and the bombarding is performed after each atomic layer of the spacer layer is formed.

11. The method of claim 8, wherein the component of the transistor comprises a source/drain region or a source/drain silicide region.

12. The method of claim 8, wherein the horizontal portions of the sub-layers formed by the plurality of cycles are removed in an isotropic etch, and in the isotropic etch, the horizontal portions has a higher etching rate than the vertical portions.

13. The method of claim 8, wherein the horizontal portions of the sub-layers formed by the plurality of cycles are removed in an isotropic etch, and the isotropic etch comprises a dry etch.

14. The method of claim 8, wherein the horizontal portions of the sub-layers formed by the plurality of cycles are removed in an isotropic etch, and the isotropic etch comprises a wet etch.

15. The method of claim 8, wherein the depositing the sub-layer is performed using radicals of nitrogen, and the bombarding is performed using ions of nitrogen.

16. A method comprising:
   forming an Inter-Layer Dielectric (ILD) to cover a gate stack;
   etching the ILD to form a source/drain contact opening;
   implanting a semiconductor substrate through the source/drain contact opening to form a source/drain region;
   forming a blanket spacer layer to extend into the source/drain contact opening;
   performing an isotropic etch on the blanket spacer layer to remove a portion of the blanket spacer layer in the source/drain contact opening, and a remaining portion of the blanket spacer layer in the source/drain contact opening forms a contact plug spacer; and
   filling a conductive material into the source/drain contact opening to form a source/drain contact plug, wherein the source/drain contact plug is encircled by the contact plug spacer.

17. The method of claim 16 further comprising:
   etching the ILD to form a gate contact opening, wherein the blanket spacer layer is formed before the gate contact opening is formed, and an additional portion of the conductive material is filled into the gate contact opening to form a gate contact plug, and the gate contact plug is in physical contact with the ILD.

18. The method of claim 16 further comprising:
   etching the ILD to form a gate contact opening, wherein the blanket spacer layer extends into both the gate contact opening and the source/drain contact opening.

19. The method of claim 16, wherein immediately after the blanket spacer layer is formed, horizontal portions of the blanket spacer layer have a lower density than vertical portions of the blanket spacer layer.

20. The method of claim 16, wherein in the isotropic etch, horizontal portions of the blanket spacer layer have a higher etching rate than vertical portions of the blanket spacer layer.

* * * * *